United States Patent
Berke

(10) Patent No.: US 8,402,208 B2
(45) Date of Patent: Mar. 19, 2013

(54) CONFIGURABLE MEMORY CONTROLLER/MEMORY MODULE COMMUNICATION SYSTEM

(75) Inventor: Stuart Allen Berke, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 684 days.

(21) Appl. No.: 12/574,229

(22) Filed: Oct. 6, 2009

(65) Prior Publication Data

US 2011/0082971 A1   Apr. 7, 2011

(51) Int. Cl.
*G06F 12/00* (2006.01)
*G06F 13/00* (2006.01)
*G06F 13/28* (2006.01)

(52) U.S. Cl. .......................... 711/105; 711/154; 711/170

(58) Field of Classification Search .................. 711/105, 711/154, 170
See application file for complete search history.

(56) References Cited

U.S. PATENT DOCUMENTS

| | | | |
|---|---|---|---|
| 5,966,736 A * | 10/1999 | Gittinger et al. | 711/207 |
| 6,446,158 B1 | 9/2002 | Karabatsos | |
| 6,771,526 B2 * | 8/2004 | LaBerge | 365/63 |
| 6,795,906 B2 | 9/2004 | Matsuda | |
| 6,977,864 B2 | 12/2005 | Koo | |
| 2007/0079049 A1* | 4/2007 | LaBerge | 711/5 |
| 2010/0106904 A1* | 4/2010 | Berke et al. | 711/114 |
| 2010/0135097 A1* | 6/2010 | Berke | 365/226 |

* cited by examiner

*Primary Examiner* — Jared Rutz
*Assistant Examiner* — Ryan Bertram
(74) *Attorney, Agent, or Firm* — Haynes and Boone, LLP

(57) ABSTRACT

A memory system includes a first memory module and a second memory module. A memory controller is coupled to the first and second memory modules and reads configuration information from the first and second memory modules using a memory channel. The controller also configures a switch coupled between the controller and one of the memory modules to communicate using either a chip select line or a memory address line.

20 Claims, 8 Drawing Sheets

| 2011 CPU CONTROL SIGNALS PER CHANNEL | |
|---|---|
| CLK | 4 |
| CKE | 4 |
| ODT | 6 |
| CS | 8 |
| A16/CS3 | 1 |
| A17/CS2 | 1 |

| MAINSTREAM 2 SOCKET SERVER | | | | | | | | | |
|---|---|---|---|---|---|---|---|---|---|
| | 2006 | 2007 | 2009 | 2010 | 2011 | 2012 | 2013 | 2014 |
| DRAM | DDR2 | DDR2 | DDR3 | DDR3 | DDR3 | DDR3 | DDR4 | DDR4 |
| DRAM VOLTAGE SUPPORTED | 1.8v | 1.8v, 1.5v | 1.5v | 1.5v, 1.35v | 1.5v, 1.35v | 1.5v, 1.35v, 1.25v | 1.20v | 1.20v, 1.10v |
| RANKS PER DIMM SUPPORTED | 1, 2 | 1, 2, 4 | 1, 2, 4 | 1, 2, 4 | 1, 2, 4, 8 | 1, 2, 4, 8 | 1, 2, 4, 8 | 1, 2, 4, 8 |
| DIMM TYPES SUPPORTED IN STANDARD DIMM CONNECTOR | FBDIMM | FBDIMM | RDIMM, UDIMM, LR-DIMM | RDIMM, UDIMM, LR-DIMM | RDIMM, UDIMM, LR-DIMM | RDIMM, UDIMM, LR-DIMM | RDIMM, UDIMM, LR-DIMM | RDIMM, UDIMM, LR-DIMM |
| FREQUENCY SUPPORTED | 533, 667 | 533, 667, 800 | 800, 1066, 1333 | 800, 1066, 1333, 1600 | 800, 1066, 1333, 1600, 1866 | 800, 1066, 1333, 1600, 1866, 2133 | 1600, 1866, 2133, 2400 | 1600, 1866, 2133, 2400, 2667 |

Fig. 2

| | PER JEDEC DIMM REQUIREMENTS | | | | | | | | |
|---|---|---|---|---|---|---|---|---|---|
| | UDIMM | UDIMM | RDIMM | RDIMM | RDIMM | LRDIMM | LRDIMM | LRDIMM |
| | 1-RANK | 2-RANK | 1-RANK | 2-RANK | 4-RANK | 2-RANK | 4-RANK | 8-RANK |
| CLK (DIFFERENTIAL PAIR) | 1 | 2 | 1 | 1 | 1 | 1 | 1 | 1 |
| CKE | 1 | 2 | 1 | 2 | 2 | 1 OR 2 | 1 OR 2 | 1 OR 2 |
| ODT | 1 | 2 | 1 | 2 | 2 | 1 OR 2 | 1 OR 2 | 1 OR 2 |
| CS | 1 | 2 | 0 | 2 | 4 | 1 OR 2 | 2 OR 4 | 2 OR 4 |
| A16/CS3 | 0 | 0 | 0 | 0 | 0 | 0 | 1 | 1 |
| A17/CS2 | 0 | 0 | 0 | 0 | 0 | 0 | 0 | 1 |

Fig. 4
(PRIOR ART)

| | NUMBER OF DIMMs PER CHANNEL SUPPORTED WITH 2011 CPUs ||||||
| | 2 SLOT CHANNEL || 3 SLOT CHANNEL || 4 SLOT CHANNEL ||
| | PRIOR | WITH DISCLOSURE | PRIOR | WITH DISCLOSURE | PRIOR | WITH DISCLOSURE |
| --- | --- | --- | --- | --- | --- | --- |
| 1-RANK UDIMMs | 2 | 2 | 2 | 2 | 2 | 2 |
| 2-RANK UDIMMs | 2 | 2 | 1 | 2* | 0 | 2* |
| 1-RANK RDIMMs | 2 | 2 | 3 | 3 | 4 | 4 |
| 2-RANK RDIMMs | 2 | 2 | 3 | 3 | 2 | 3* |
| 4-RANK RDIMMs | 2 | 2 | 1 | 2* | 0 | 2* |
| 2-RANK LRDIMMs | 2 | 2 | 3 | 3 | 2 | 4* |
| 4-RANK LRDIMMs | 0 | 2* | 0 | 3* | 0 | 4* |
| 8-RANK LRDIMMs | 0 | 2* | 0 | 3* | 0 | 4* |

| PINOUT COMPARISON BASED ON MODULE TYPE | | | | |
|---|---|---|---|---|
| | RDIMM | | UDIMM | |
| PIN NUMBER | SIGNAL | NOTES | SIGNAL | NOTES |
| 48, 49 | VTT | ADDITIONAL CONNECTION FOR TERMINATION VOLTAGE FOR ADDRESS/COMMAND/CONTROL/CLOCK NETS | NC | NOT USED ON UDIMMs |
| 120, 240 | VTT | TERMINATION VOLTAGE FOR ADDRESS/COMMAND/CONTROL/CLOCK NETS | VTT | TERMINATION VOLTAGE FOR ADDRESS/COMMAND/CONTROL/CLOCK NETS |
| 53 | Err_Out_n | CONNECTED TO THE REGISTER ON ALL RDIMMs | NC | NOT USED ON UDIMMs |
| 63 | CK1_t | CK1_t AND CK1_c ARE TERMINATED BUT NOT USED ON RDIMMs | CK1_t | USED FOR 2-RANK UDIMMs, NOT USED ON SINGLE-RANK UDIMMs, BUT TERMINATED |
| 64 | CK1_c | | CK1_c | |
| 68 | Par_In | CONNECTED TO THE REGISTER ON ALL RDIMMs | NC | NOT USED ON UDIMMs |
| 76 | S1_n | CONNECTED TO THE REGISTER ON ALL RDIMMs | S1_n | USED FOR DUAL-RANK UDIMMs, NOT CONNECTED ON SINGLE-RANK UDIMMs |
| 77 | ODT1, NC | CONNECTED TO THE REGISTER ON DUAL- AND QUAD-RANK RDIMMs; NC ON SINGLE-RANK RDIMMs | ODT1, NC | USED FOR DUAL-RANK UDIMMs, NOT CONNECTED ON SINGLE-RANK UDIMMs |
| 79 | S2_n, NC | CONNECTED TO THE REGISTER ON QUAD-RANK RDIMMs, NOT CONNECTED ON SINGLE OR DUAL RANK RDIMMs | NC | NOT USED ON UDIMMs |
| 167 | NC | TEST INPUT USED ONLY ON BUS ANALYSIS PROBES | NC | TEST INPUT USED ONLY ON BUS ANALYSIS PROBES |

TO Fig. 6b

| Pin | Signal | Description | Signal | Description |
|---|---|---|---|---|
| 169 | CKE1 | CONNECTED TO THE REGISTER ON DUAL- AND QUAD-RANK RDIMMs; NC ON SINGLE-RANK RDIMMs | CKE1, NC | USED FOR DUAL-RANK UDIMMs, NOT CONNECTED ON SINGLE-RANK UDIMMs |
| 171 | A15 | CONNECTED TO THE REGISTER ON ALL RDIMMs | A15, NC | DEPENDING ON DEVICE DENSITY, MAY NOT BE CONNECTED TO SDRAMs ON UDIMMs. HOWEVER, THESE SIGNALS ARE TERMINATED ON UDIMMs. A15 NOT ROUTED ON SOME RCs |
| 172 | A14 | | A14 | |
| 196 | A13 | | A13 | |
| 198 | S3_n, NC | CONNECTED TO THE REGISTER ON QUAD-RANK RDIMMs, NOT CONNECTED ON SINGLE- OR DUAL-RANK RDIMMs | NC | NOT USED ON UDIMMs |
| 39, 40, 45, 46, 158, 159, 164, 165 | CBn | USED ON ALL RDIMMs; (n = 0...7) | NC, CBn | USED ON x72 UDIMMs, (n = 0...7); NOT USED ON x64 UDIMMs |
| 125, 134, 143, 152, 161, 203, 212, 221, 230 | DQSn_t, TDQSn_t | CONNECTED TO DQS_t ON x4 SDRAMs, TDQS_t ON x8 SDRAMs ON RDIMMs; (n = 9...17) | DMn | CONNECTED TO DM ON x8 DRAMs, UDM OR LDM ON x16 DRAMs ON UDIMMs; (n = 0...8) |
| 126, 135, 144, 153, 162, 204, 213, 222, 231 | DQSn_c, TDQSn_c | CONNECTED TO DQS_c ON x4 DRAMs, TDQS_c ON x8 SDRAMs ON RDIMMs; (n = 9...17) | NC | NOT USED ON UDIMMs |
| 187 | EVENT_n NC | CONNECTED TO OPTIONAL THERMAL SENSING COMPONENT. NC ON MODULES WITHOUT A THERMAL SENSING COMPONENT | EVENT_n NC | CONNECTED TO THE THERMAL SENSING COMPONENT ON ECC DIMMs. NO CONNECTION ON NON-ECC DIMMs |

NC = NO INTERNAL CONNECTION

Fig. 6b
(PRIOR ART)

CONFIGURABLE MEMORY CONTROLLER/MEMORY MODULE COMMUNICATION SYSTEM

BACKGROUND

The present disclosure relates generally to information handling systems (IHSs), and more particularly to memory module optimization for an IHS.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHSs include memory modules that store data which is used during operations of the IHS. A type of memory module includes dynamic random access memory (DRAM) circuits which are known as dual in-line memory modules (DIMMs). These memory modules are generally removable from the IHS using one or more memory sockets so that a user can add, remove, or replace memory modules.

DIMMs may operate using a standard known as a double-data-rate (DDR) standard. There are also mutually exclusive DDR standards known as DDR2, DDR3 and DDR4. An IHS may have two or more memory sockets, and each socket may couple with a different type of DIMM using a different standard (e.g., DDR2 or DDR3). In other words, there a number of different DIMM types that may be installed into an IHS via an industry standard connector socket. One such socket is known as a 240-pin DDR3 connector. IHSs generally support different DIMM types, such as unbuffered DIMMs (UDIMMs), registered DIMM (RDIMMs), and load reduced (aka "Load Decoupled" or "High-Density Reduced Load") DIMMs (LR-DIMMs). However, different types of DIMMs consume varying numbers of clock signals (CLK), clock enable signals (CKE), on-die termination signals (ODT), and rank chip select signals (CS). Some of these signals are configurable via LR-DIMM control and status registers (CSRs). Complicating memory configuration matters for IHS designers, the number of physical ranks per DIMM varies from 1 to 8, the number of different operating voltages is 2 and will soon be 3, and the number of possible operating frequencies is now 3 but will soon be 5-6. An operating frequency of a DIMM is a function of DIMM type, number of data and address/control loads per DIMM, IO drivers, and physical channel characteristics.

Additionally, memory controllers that control the DIMMs have a limited number of clock signals, clock enable signals, on-die termination, and rank chip select signals available per channel due to either physical ball-out and package limitations, memory controller CSRs and logic limitations, or other limitations. Thus, the controllers typically provide a generally useful set of control signals for many, typical applications, and provide the system provider some flexibility as to how to hook them up to actual DIMM sockets. However a design issue exists for current DDR2 based servers, such as those using Advanced Micro Designs (AMDs) socket F processors, which support only RDIMMs. Due to memory controller chip select limitations (e.g., 8 per channel), the system provider needs to determine if they support 2 DIMMs per channel with 4 chip selects per DIMM (e.g., up to quad rank), or if they support 4 DIMMs per channel with only 2 chip selects per DIMM (e.g., up to dual rank). This selection is limiting to the IHS designer and is done via point-to-point routing of chip selects to DIMM connectors.

Accordingly, it would be desirable to provide a system for IHS memory module optimization.

SUMMARY

According to one embodiment, a memory system includes a first memory module and a second memory module. A memory controller is coupled to the first and second memory modules and reads configuration information from the first and second memory modules using a memory channel. The controller also configures a switch coupled between the controller and one of the memory modules to communicate using either a chip select line or a memory address line.

BRIEF DESCRIPTION OF THE DRAWINGS

FIG. 2 illustrates a table of an embodiment of a server IHS DIMM roadmap.

FIG. 4 illustrates a table of an embodiment of Joint Electronic Devices Engineering Council (JEDEC) DIMM requirements.

FIG. 5 illustrates a table of an embodiment of number of DIMMs per channel supported with an embodiment of a processor.

FIGS. 6a and 6b illustrate a table of a prior art embodiment of pin out comparisons based on DIMM module type.

DETAILED DESCRIPTION

For purposes of this disclosure, an IHS 100 includes any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an IHS 100 may be a personal computer, a network storage device, or any other suitable device and may vary in size, shape, performance, functionality, and price. The IHS 100 may include random access memory (RAM), one or more processing resources such as a central processing unit (CPU) or hardware or software control logic, read only memory (ROM), and/or other types of nonvolatile memory. Additional components of the IHS 100 may include one or more disk drives, one or more network ports for communicating with external devices as well as various input and output (I/O)

devices, such as a keyboard, a mouse, and a video display. The IHS 100 may also include one or more buses operable to transmit communications between the various hardware components.

Figures 1, 3:
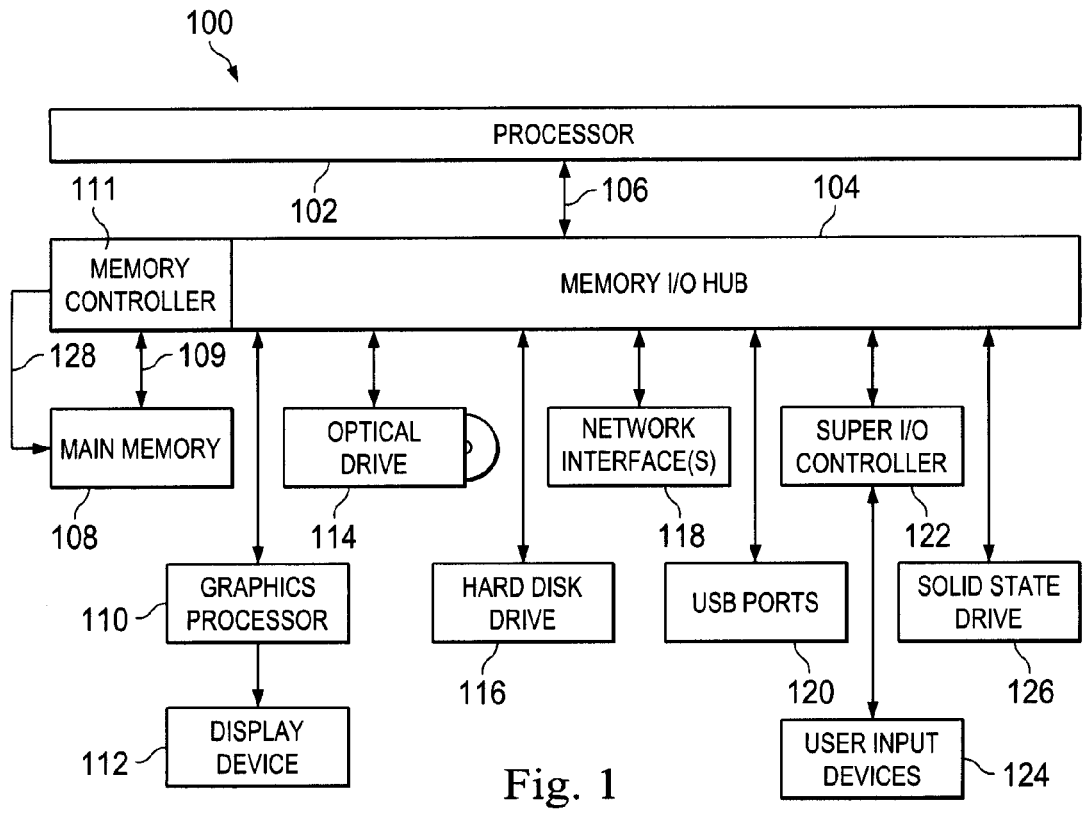
FIG. 1 illustrates an embodiment of an information handling system (IHS).
FIG. 3 illustrates a table of an embodiment of a processor's control signals per channel.

FIG. 1 is a block diagram of one IHS 100. The IHS 100 includes a processor 102 such as an Intel Pentium™ series processor or any other processor available. A memory I/O hub chipset 104 (comprising one or more integrated circuits) connects to processor 102 over a front-side bus 106. Memory I/O hub 104 provides the processor 102 with access to a variety of resources and includes a memory controller 111. Main memory 108 connects to memory I/O hub 104 over a memory or data bus 109. The main memory 108 is configured as dual in-line memory modules (DIMMs). In other embodiments, the main memory 108 may be configured as other types of memory modules. A graphics processor 110 also connects to memory I/O hub 104, allowing the graphics processor to communicate, e.g., with processor 102 and main memory 108. Graphics processor 110, in turn, provides display signals to a display device 112.

Other resources can also be coupled to the system through the memory I/O hub 104 using a data bus, including an optical drive 114 or other removable-media drive, one or more hard disk drives 116, one or more network interfaces 118, one or more Universal Serial Bus (USB) ports 120, and a super I/O controller 122 to provide access to user input devices 124, etc. The IHS 100 may also include a solid state drive (SSDs) 126 in place of, or in addition to main memory 108, the optical drive 114, and/or a hard disk drive 116. It is understood that any or all of the drive devices 114, 116, and 126 may be located locally with the IHS 100, located remotely from the IHS 100, and/or they may be virtual with respect to the IHS 100.

Not all IHSs 100 include each of the components shown in FIG. 1, and other components not shown may exist. Furthermore, some components shown as separate may exist in an integrated package or be integrated in a common integrated circuit with other components, for example, the processor 102 and the memory I/O hub 104 can be combined together. As can be appreciated, many systems are expandable, and include or can include a variety of components, including redundant or parallel resources.

The present disclosure provides a system to actively detect installed main memory 108 types (e.g., DIMM memory module types), and optimize memory capacity, number of ranks, reliability-availability-serviceability (RAS) modes, and performance by controlling planar based switching elements on the Clock, Clock Enable, On-Die Termination, and Rank Chip Select signals between the memory controller 111 and the main memory 108 modules. The present disclosure discusses memory 108 as DIMM memory modules, however, it is to be understood that other types of memory modules may be used with the teachings of the present disclosure.

In other words, the present disclosure provides a system to flexibly couple a memory controller clock and control signals to DIMMs using a memory channel, such as a DDR channel, rather than having a fixed topology, as is traditionally used. By using the teachings of this disclosure, single planar/motherboard designs are able to support a greater variety of DIMM types, DIMMs per channel, capacities, RAS features, and improved performance. Because no single DIMM type is optimal for IHS manufacturers with respect to cost, capacity, power, performance, and RAS, it is desirable for general purpose systems to support as many types as possible in a single design. It is to be understood that a memory controller includes any device driving the memory device physical channel (e.g., the double data rate (DDR)) physical channel (e.g., processor sockets, memory controller hub, memory buffers, etc.).

The IHS main memory 108 is in the form of memory modules that store data that is to be used during operations of the IHS 100. A type of memory module includes dynamic random access memory (DRAM) circuits. These circuits are called dual in-line memory modules (DIMMs). These DIMMs are generally removable from the IHS 100 using one or more memory sockets, thus allowing a user the ability to add, remove, or replace memory modules. DIMMs may operate using a standard known as a double-data-rate (DDR) standard. There are mutually exclusive DDR standards known as DDR2, DDR3 and DDR4 (planned for the future). The IHS 100 may have two or more memory sockets, and each socket may couple with a different type of DIMM using a different standard, such as DDR2 or DDR3. In other words, there a number of different DIMM types that may be coupled to the IHS 100 via an industry standard connector socket, such as a 240-pin DDR3 connector socket. IHSs generally support different DIMM types, such as unbuffered DIMMs (UDIMMs), registered DIMM (RDIMMs), and load reduced (aka "Load Decoupled" or "High-Density Reduced Load") DIMMs (LR-DIMMs). However, different types of DIMMs use a variety of numbers of clock signals (CLK), clock enable signals (CKE), on-die termination signals (ODT), and rank chip select signals (CS). Some of these signals are configurable via LR-DIMM chip select ranks (CSRs). The number of physical ranks per DIMM varies from 1 to 8 or more, the number of different operating voltages is 2 and may be 3 or more, and the number of possible operating frequencies is 3 but may be 5-6 or more. An operating frequency of a DIMM is a function of DIMM type, number of data and address/control loads per DIMM, IO drivers, and physical channel characteristics. Examples of this are found in FIG. 2, which illustrates a table of an embodiment of a server IHS DIMM roadmap.

FIG. 3 illustrates a table of an embodiment of a processor's control signals per channel. FIG. 3 lists the expectations for a mainstream 2S server memory controller per channel that are expected to be implemented in 2011. In this example, there are 4 CLK, 4 CKE, 6 ODT 8 CS, and 2 A17:16 signals available per channel. In other embodiments, varying numbers of each are possible. Memory controllers that control the DIMMs have a limited number of clock signals, clock enable signals, on-die termination, and rank chip select signals available per channel due to either physical ball-out/pin-out and package limitations, memory controller CSRs and logic limitations, or other limitations. Thus, the controllers typically provide a generally useful set of control signals for many, typical applications, and provide the system provider some flexibility as to how to hook them up to actual DIMM sockets. Examples for 2011 mainstream server signal availability is provided in FIG. 3. However, a design issue exists for current DDR2 based servers, such as those using Advanced Micro Designs (AMDs) socket F processors, which support only RDIMMs. Due to memory controller chip select limitations (e.g., 8 per channel), the system provider needs to determine if they support 2 DIMMs per channel with 4 chip selects per DIMM (e.g., up to quad rank), or if they support 4 DIMMs per channel with only 2 chip selects per DIMM (e.g., up to dual rank). This selection is limiting to the IHS designer and is done via point-to-point routing of chip selects to DIMM connectors.

FIG. 4 illustrates a table of an embodiment of Joint Electronic Devices Engineering Council (JEDEC) DIMM requirements. FIG. 4 lists the per JEDEC DIMM type requirements for a clock signal (CLK), a clock enable signal (CKE), an on-die termination (ODT), and a rank chip selects signal (CS) for various types of DDR3 based server and workstation DIMMs. Unbuffered DIMMs (UDIMMs) include single and dual rank, registered DIMMs (RDIMMs) include single dual and quad rank, and load reduced (LR-DIMMs) include single dual quad and octal rank variations. LR-DIMMS may be programmed in various modes that affect the number of CKE, ODT, and CS lines used in operation.

JEDEC LR-DIMMs operate in either "direct mapped" or "rank multiplied" mode, where CS lines are mapped as viewed by the memory controller. In direct mapped mode, each memory controller CS line controls a physical rank on an LR-DIMM. In rank multiplied mode, the lower two DIMM CS lines act as rank selects, and the upper two CS lines are provided by the memory controller as Address 17:16. This allows the LR-DIMM to appear as a dual rank DIMM even though there are 4 or 8 physical ranks of DRAMs.

FIG. 5 illustrates a table of an embodiment of number of DIMMs per channel supported with an embodiment of a 2011 processor. FIG. 5 demonstrates improvements on possible DIMM configurations using the present disclosure. For 2, 3, and 4 DIMM connector slots per channel configurations, FIG. 5 lists the max number of DIMMs of each type that may be supported, per current state of the art ("prior") as well as with the systems of the present disclosure ("with disclosure"). Cells with an * highlight the extra configurations that are supportable in the IHS 100 by using the systems of the present disclosure. FIGS. 6a and 6b illustrate a table of an embodiment of pin out comparisons based on DIMM module type. Accordingly, FIGS. 6a and 6b are an excerpt from the JEDEC DDR3 DIMM Specification, further illustrating how different DIMM types (UDIMMs and RDIMMs) make use of various subsets of control signals.

Figure 7:
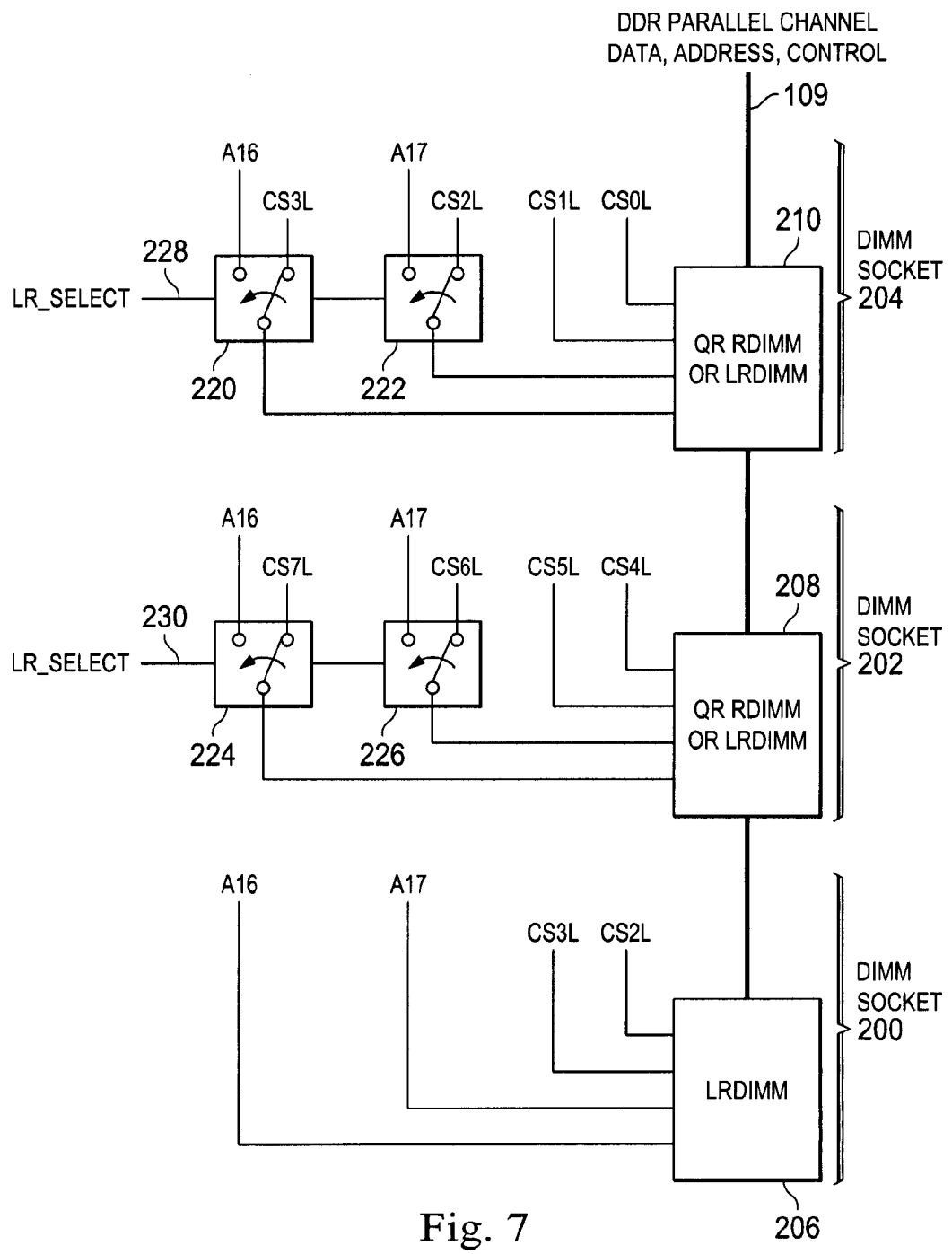
FIG. 7 illustrates a block diagram of an embodiment of flexible 3 slot dual in-line memory module (DIMM) system on a data channel of the IHS of FIG. 1.

FIG. 7 illustrates a block diagram of an embodiment of flexible 3 slot dual in-line memory module (DIMM) system on a data channel of the IHS 100. In this embodiment, DIMM sockets 200, 202 and 204 are coupled to the processor 102 via the data bus 109. In this embodiment, an LRDIMM 206 is plugged into DIMM socket 200, either a QR RDIMM or LRDIMM 208 is plugged into DIMM socket 202 and either a QR RDIMM or LRDIMM 210 is plugged into DIMM socket 204. It should be understood that any number of the DIMM sockets may receive any type of DIMM. A number of control lines 128 couple the memory controller 111 to the memory DIMMs 206, 208 and 210. DIMM 206 couples to address lines A16 and A17 and also to chip select lines CS3L and CS2L. DIMM 208 couples to chip select lines CS4L and CS5L. DIMM 208 also couples to either chip select line CS7L or address line A16 through switch 224. Additionally, DIMM 208 couples to either chip select line CS6L or address line A17 through switch 226. LR_Select 230 control signal triggers switches 224 and 226 to determine whether A16 or CS7L is coupled to the DIMM 208 and whether A17 or CS6L is coupled to the DIMM 208. DIMM 210 couples to chip select lines CS0L and CS1L. DIMM 210 also couples to either chip select line CS3L or address line A16 through switch 220. Additionally, DIMM 210 couples to either chip select line CS2L or address line A17 through switch 222. LR_Select 228 control signal triggers switches 220 and 222 to determine whether A16 or CS3L is coupled to the DIMM 210 and whether A17 or CS2L is coupled to the DIMM 210.

This embodiment shows a three DIMM slot system, having data support on a channel. Two QR RDIMMs are used and the switches 220, 222, 224 and 226 (e.g., field-effect transistor (FET) multiplexers (Muxes)) switch in two upper chip selects per DIMM; otherwise parallel memory address signals A17: 16 are switched to DIMM sockets 202 and 204. Accordingly, this allows two QR RDIMMs, or three QR/OR LR-DIMMs to be supported on the same planar.

Accordingly, FIG. 7 shows one embodiment, with "quick switches" or "FET-MUXes" used to steer chip select (CS) and MA17:16 lines from the memory controller 111 to three DIMMs. In one LR_SELECT switch position, the system can support two quad rank RDIMMs. In the alternate LR_SELECT position, the system can support three quad or octal rank LR_DIMMs. This flexibility is not possible with previous state of the art embodiments. By using switching elements on the CLK, CKE, ODT, CS, and MA17:16 lines, the configurations shown in FIG. 5 can be supported. Additionally, the switching elements 220, 222, 224 and 226 may be implemented in various technologies that support the required frequencies and signal integrity/timing. It can be implemented as 1:2 as shown, or 1:N in general, to maintain one electrical load to the memory controller 111. As such, it is to be understood that many embodiments may be used with the present disclosure to achieve the results provided herein. Furthermore, it is to be understood that the memory controller 111 and the DIMMs 208 and 210 do not know that the switches 220, 222, 224 and 226 are in series with the communication line.

Figure 8:
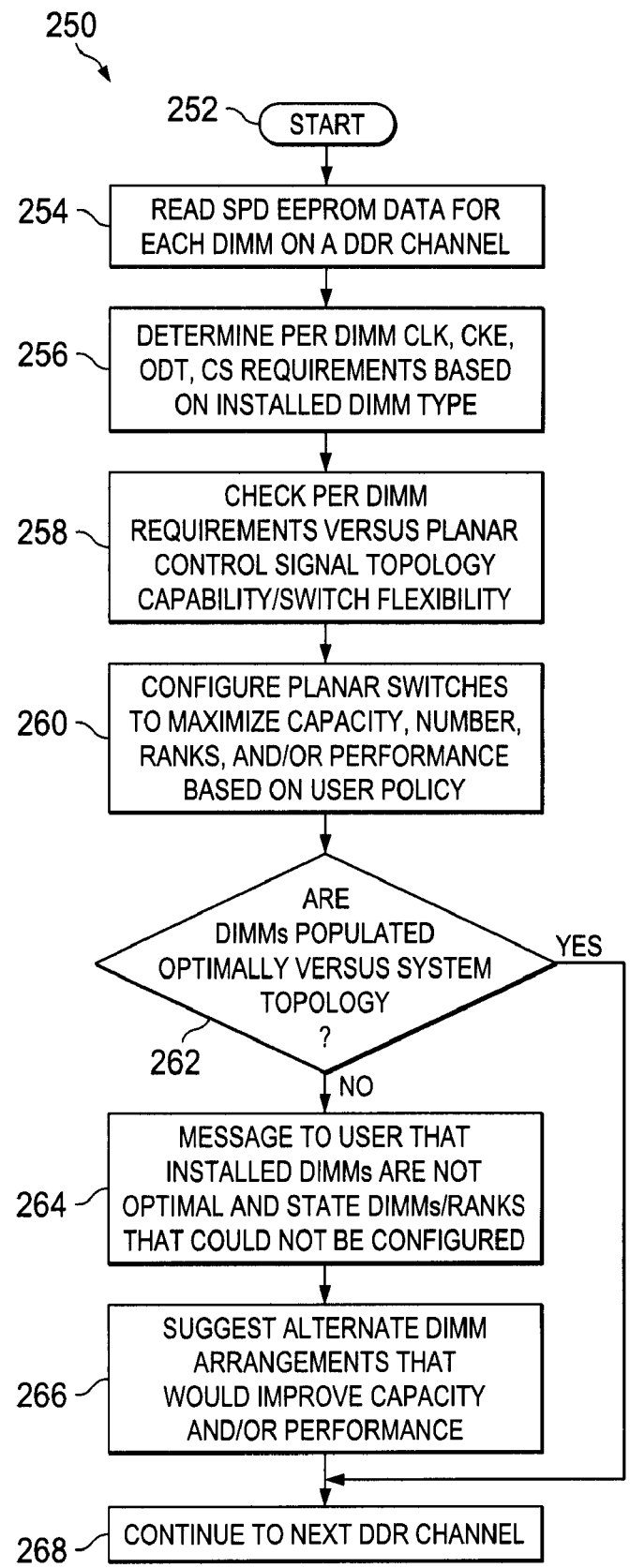
FIG. 8 illustrates a flow chart of an embodiment of a method to optimize memory modules for the IHS of FIG. 1.

FIG. 8 illustrates a flow chart of an embodiment of a method 250 to optimize memory modules for the IHS 100. The method 250 begins at block 252 when the IHS 100 enters a power-on self test (POST) or similar state. Using the method 250, the systems of the present disclosure perform a channel-by-channel process in the POST for each channel, checking each DIMM in each channel. The method 250 proceeds to block 254 where the method 250 reads serial presence detect (SPD) EEPROM data for each DIMM on a double data rate (DDR) channel. The method 250 proceeds to block 256 where the method uses the SPD data and determines per DIMM clock (CLK), clock enable (CKE), on-die termination (ODT) and chip select (CS) requirements based on installed DIMM types. The method 250 then proceeds to block 258 where the method 250 checks per DIMM requirements vs. planar control signal topology capability/switch flexibility. Next, the method 250 proceeds to block 260 where the method 250 configures planar switches (e.g., switches 220, 222, 224 and 226) to maximize capacity, number ranks, and/or performance based on a pre-defined user policy. The method 250 then proceeds to decision block 262 to determine whether all found DIMMs are populated optimally vs. system topology. If no, the method 250 determines that the DIMMs are not populated optimally vs. system topology, the method 250 proceeds to block 264 where the method 250 notifies a user that the installed DIMMs are not configured optimally and indicate DIMMs/ranks that could not be configured. The method 250 then proceeds to block 266 where the method 250 suggests to a user alternate DIMM arrangements that would improve capacity and/or performance. The method 250 then proceeds to block 268 to continue to the next DDR channel and continues this process until all channels are configured. On the other hand, if at decision block 262 the method 250 determines that yes, all DIMMs are populated optimally vs. system topology, the method 250 then proceeds to block 268.

In other words, the method 250 uses the IHS 100 firmware to read the SPD EEPROM DIMM Type fields for each DIMM on a channel to determine the DIMM types installed. The method 250 determines the per DIMM and overall per channel control signal requirements based on built-in requirements tables for each DIMM type. The method 250 then compares the installed DIMM requirements against the resources provided by the memory controller 111, and the flexibility provided by the planar switches (e.g., 220, 222, 224 and 226). Based on a user policy (e.g., a policy configured as a BIOS or other setting), the method 250 causes the system to manipulate the switch select lines (e.g., LR_SELECT 228 and/or LR_SELECT 230) to maximize capacity, performance, RAS and etc. Next, the method 250 checks to see if all installed DIMMs are optimally configured. If not, a message may be provided/logged noting some elements could not be optimized or configured, and then the method 250 optionally provides suggestions on how to change the installed DIMM population to improve the memory configuration. It should be understood that many other flows are possible for the system of the present disclosure, including those that provide system-wide configuration and optimizations.

Advantages of the present disclosure include, but are not limited to allowing a system to isolate DIMMs that violate population rules, improved diagnostics and fault isolation and provides a method that may support a planar with combination DDR3 and DDR4 DIMMs (e.g., assuming the memory controller 111 support and DDR4).

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A memory system comprising:
a first memory module;
a second memory module;
at least one switch coupled to at least one of the first memory module and the second memory module, wherein the at least one switch is coupled to each of a chip select line and a memory address line; and
a memory controller coupled to the first memory module, the second memory module, and the switch, wherein the memory controller is operable to reads configuration information from the first and second memory modules using a memory channel, determine a memory module type for each of the first memory module and the second memory module, and configures the at least one switch based on at least one memory module type requirement and at least one memory controller resource to allow communication between the memory controller and the at least one of the first memory module and the second memory module using either the chip select line or the memory address line.

2. The memory system of claim 1, wherein at least one of the first memory module and the second memory modules is a dual in-line memory module (DIMM).

3. The memory system of claim 2, wherein the first memory module and the second memory module are one of unbuffered DIMM (UDIMM), registered DIMM (RDIMM), and load reduced DIMM (LR-DIMM).

4. The memory system of claim 1, wherein the configuration information is serial presence detect (SPD) information.

5. The memory system of claim 1, wherein the first memory module and the second memory modules include one of single rank, dual rank, quad rank, and octal rank.

6. The memory system of claim 1, wherein the memory address line is one of A16 and A17.

7. The memory system of claim 1, wherein the chip select line is one of CS2 and CS3.

8. An information handling system (IHS) comprising:
a processor; and
a memory system coupled to the processor, wherein the memory system includes:
a first memory module;
a switch coupled to the first memory module, a chip select line, and a memory address line; and
a memory controller coupled to the first memory module and the switch, wherein the memory controller is operable to reads configuration information from the first memory modules using a memory channel, determine a memory module type for the first memory module, and configures the switch based on at least one memory module type requirement and at least one memory controller resource to allow communication between the memory controller and the first memory module using either the chip select line or the memory address line.

9. The IHS of claim 8, wherein the first memory module is a dual in-line memory module (DIMM).

10. The IHS of claim 8, wherein the first memory modules is one of unbuffered DIMM (UDIMM), registered DIMM (RDIMM), and load reduced DIMM (LR-DIMM).

11. The IHS of claim 8, wherein the configuration information is serial presence detect (SPD) information.

12. The IHS of claim 8, wherein the first memory module includes one of single rank, dual rank, quad rank, and octal rank.

13. The IHS of claim 8, wherein the memory address line is one of A16 and A17.

14. The IHS of claim 8, wherein the chip select line is one of CS2 and CS3.

15. A method comprising:
providing a memory controller coupled to a first memory module and a second memory module, wherein at least one switch is coupled between the memory controller and at least one of the first memory module and the second memory module, and wherein the at least one switch is also coupled to a chip select line and a memory address line;
reading configuration information from the first memory module and the second memory module using a memory channel;
determining a memory module type for each for the first memory module and the second memory module; and
configuring the at least one switch based on at least one memory module type requirement and at least one memory controller resource to allow communication between the memory controller and the at least one of the first memory module and the second memory module using either the chip select line or the memory address line.

16. The method of claim 15, wherein one of the first memory module and the second memory module is a dual in-line memory module (DIMM).

17. The method of claim 15, wherein the first memory module and the second memory module are one of unbuffered DIMM (UDIMM), registered DIMM (RDIMM), and load reduced DIMM (LR-DIMM).

18. The method of claim 15, wherein the configuration information is serial presence detect (SPD) information.

19. The method of claim 15, wherein the first memory module and the second memory module include one of single rank, dual rank, quad rank, and octal rank.

20. The method of claim 15, wherein the memory address line is one of A16 and A17 and wherein the chip select line is one of CS2 and CS3.

* * * * *